(12) United States Patent  (10) Patent No.: US 8,154,121 B2
Shah et al.  (45) Date of Patent: *Apr. 10, 2012

(54) POLYMER INTERLAYER DIELECTRIC AND PASSIVATION MATERIALS FOR A MICROELECTRONIC DEVICE

(75) Inventors: Kunal Shah, Hillsboro, OR (US); Michael Haverty, Mountain View, CA (US); Sadasivan Shankar, Cupertino, CA (US); Doug Ingerly, Portland, OR (US); Grant Kloster, Lake Oswego, OR (US)

(73) Assignee: Intel Corporation, Santa Clara, CA (US)

( * ) Notice: Subject to any disclaimer, the term of this patent is extended or adjusted under 35 U.S.C. 154(b) by 932 days.

This patent is subject to a terminal disclaimer.

(21) Appl. No.: 12/037,625

(22) Filed: Feb. 26, 2008

(65) Prior Publication Data

US 2009/0212421 A1 Aug. 27, 2009

(51) Int. Cl.
 *H01L 23/48* (2006.01)
(52) U.S. Cl. ......... 257/737; 438/781; 257/E23.01; 257/E21.214
(58) Field of Classification Search ........... 257/737
 See application file for complete search history.

(56) References Cited

U.S. PATENT DOCUMENTS

| | | | |
|---|---|---|---|
| 4,970,276 A * | 11/1990 | Das et al. | 525/504 |
| 6,181,569 B1 * | 1/2001 | Chakravorty | 257/737 |
| 6,605,549 B2 | 8/2003 | Leu et al. | |
| 6,717,265 B1 | 4/2004 | Ingerly et al. | |
| 6,734,118 B2 | 5/2004 | Kloster et al. | |
| 6,737,365 B1 | 5/2004 | Kloster et al. | |
| 6,790,792 B2 * | 9/2004 | Shaffer et al. | 438/790 |
| 6,861,332 B2 | 3/2005 | Park et al. | |
| 6,876,017 B2 * | 4/2005 | Goodner | 257/254 |
| 6,888,023 B2 * | 5/2005 | Tanaka et al. | 562/421 |
| 6,930,033 B2 | 8/2005 | Ingerly et al. | |
| 6,943,121 B2 | 9/2005 | Leu et al. | |
| 6,946,384 B2 | 9/2005 | Kloster et al. | |
| 6,964,919 B2 | 11/2005 | Kloster et al. | |
| 6,992,391 B2 | 1/2006 | Ott et al. | |
| 7,018,918 B2 | 3/2006 | Kloster et al. | |
| 7,030,040 B2 | 4/2006 | Goodner et al. | |
| 7,034,399 B2 | 4/2006 | Kloster et al. | |
| 7,138,158 B2 | 11/2006 | Meagley et al. | |
| 7,145,245 B2 | 12/2006 | Kloster et al. | |
| 7,164,206 B2 | 1/2007 | Kloster et al. | |
| 7,169,715 B2 | 1/2007 | Ott et al. | |
| 7,179,755 B2 | 2/2007 | Boyanov et al. | |
| 7,180,180 B2 | 2/2007 | Kloster et al. | |
| 7,214,594 B2 | 5/2007 | Wong et al. | |
| 7,220,668 B2 | 5/2007 | Park et al. | |
| 7,239,019 B2 | 7/2007 | Leu et al. | |
| 7,294,934 B2 | 11/2007 | Kloster et al. | |

(Continued)

*Primary Examiner* — David Vu
*Assistant Examiner* — Jonathan Han
(74) *Attorney, Agent, or Firm* — Cool Patent, P.C.; Joseph P. Curtin

(57) ABSTRACT

Polymer interlayer dielectric and passivation materials for a microelectronic device are generally described. In one example, an apparatus includes one or more interconnect structures of a microelectronic device and one or more polymeric dielectric layers coupled with the one or more interconnect structures, the polymeric dielectric layers including copolymer backbones having a first monomeric unit and a second monomeric unit wherein the first monomeric unit has a different chemical structure than the second monomeric unit and wherein the copolymer backbones are cross-linked by a first cross-linker or a second cross-linker, or combinations thereof.

20 Claims, 5 Drawing Sheets

U.S. PATENT DOCUMENTS

| | | |
|---|---|---|
| 7,303,989 B2 | 12/2007 | Boyanov et al. |
| 2003/0173651 A1 | 9/2003 | Wong et al. |
| 2004/0218889 A1* | 11/2004 | Shelnut et al. ............... 385/143 |
| 2008/0000875 A1 | 1/2008 | Ramachandrarao et al. |
| 2008/0122078 A1* | 5/2008 | He et al. ....................... 257/737 |

* cited by examiner

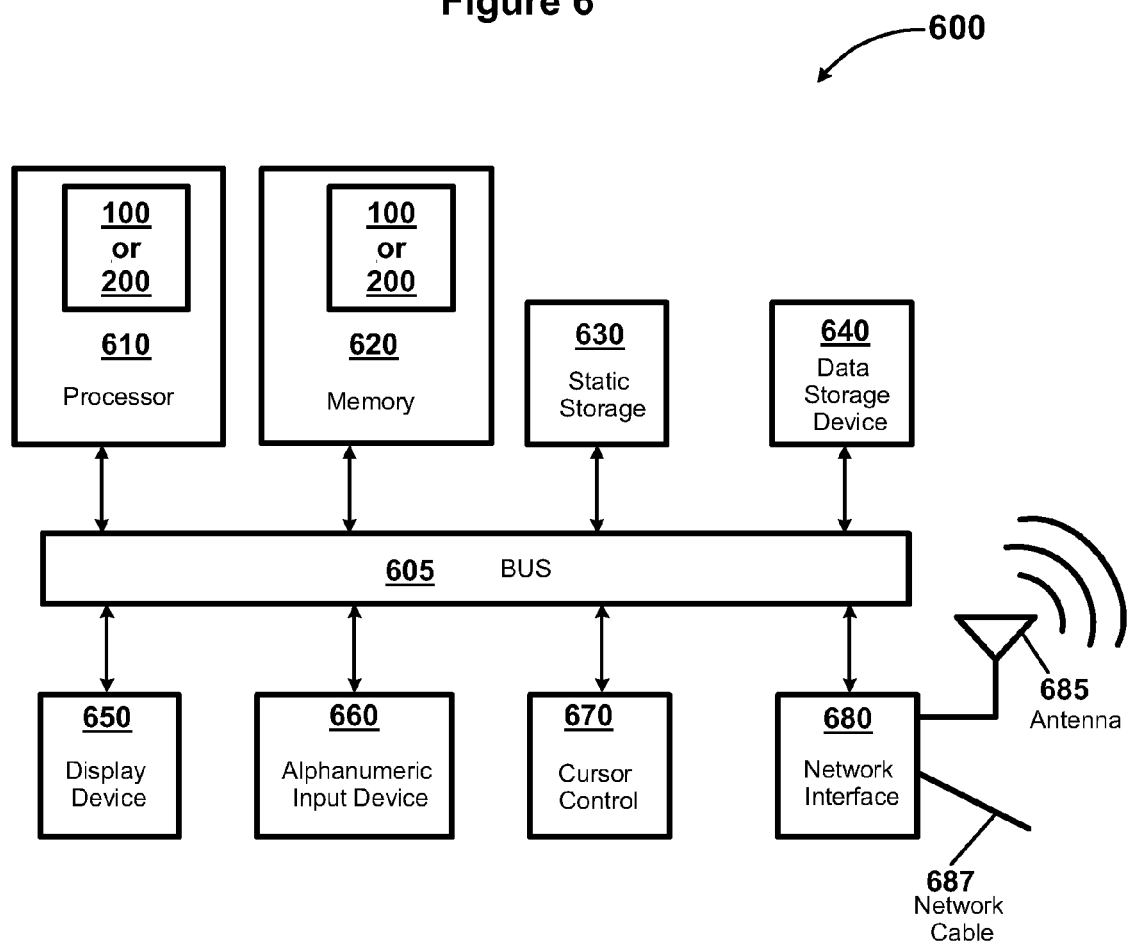

POLYMER INTERLAYER DIELECTRIC AND PASSIVATION MATERIALS FOR A MICROELECTRONIC DEVICE

BACKGROUND

Generally, microelectronic devices such, as integrated circuit (IC) devices, incorporate dielectric materials to electrically insulate electrically conductive structures and/or to provide a passivation barrier from undesired reactions or contact with undesired materials. Various mechanical and thermal properties of dielectric materials, such as fracture toughness, failure strain, modulus, and/or coefficient of thermal expansion (CTE), for example, may affect mechanical and/or thermal stability and reliability of microelectronic devices.

BRIEF DESCRIPTION OF THE DRAWINGS

Embodiments disclosed herein are illustrated by way of example, and not by way of limitation, in the figures of the accompanying drawings in which like reference numerals refer to similar elements and in which:

FIG. 6 is a diagram of an example system in which embodiments of the present invention may be used, according to but one embodiment.

Figure 1:
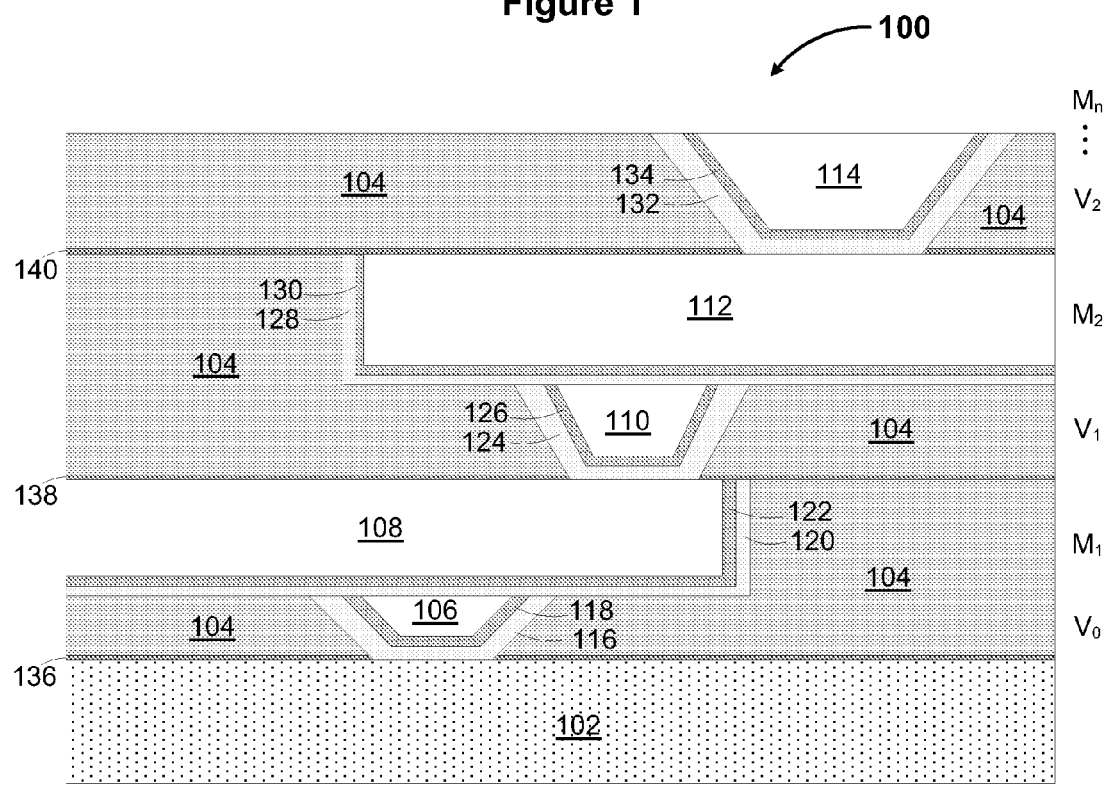
FIG. 1 is a cross-sectional side view schematic of polymer interlayer dielectric (ILD) for a microelectronic device, according to but one embodiment.

It will be appreciated that for simplicity and/or clarity of illustration, elements illustrated in the figures have not necessarily been drawn to scale. For example, the dimensions of some of the elements may be exaggerated relative to other elements for clarity. Further, if considered appropriate, reference numerals have been repeated among the figures to indicate corresponding and/or analogous elements.

DETAILED DESCRIPTION

Embodiments of polymer interlayer dielectric and passivation materials for a microelectronic device are described herein. In the following description, numerous specific details are set forth to provide a thorough understanding of embodiments disclosed herein. One skilled in the relevant art will recognize, however, that the embodiments disclosed herein can be practiced without one or more of the specific details, or with other methods, components, materials, and so forth. In other instances, well-known structures, materials, or operations are not shown or described in detail to avoid obscuring aspects of the specification.

Reference throughout this specification to "one embodiment" or "an embodiment" means that a particular feature, structure or characteristic described in connection with the embodiment is included in at least one embodiment. Thus, appearances of the phrases "in one embodiment" or "in an embodiment" in various places throughout this specification are not necessarily all referring to the same embodiment. Furthermore, the particular features, structures or characteristics may be combined in any suitable manner in one or more embodiments.

FIG. 1 is a cross-sectional side view schematic of polymer interlayer dielectric (ILD) for a microelectronic device, according to but one embodiment. In an embodiment, an apparatus 100 includes one or more transistor structures 102, polymer interlayer dielectric (ILD) 104, and one or more interconnect structures 106, 108, 110, 112, 114, each coupled as shown. In another embodiment, an apparatus 100 further includes barriers 116, 120, 124, 128, 132, liners 118, 122, 126, 130, 134, 126, and etch stop films 136, 138, 140, each coupled as shown. A microelectronic device may include a device having one or more micro-scale structures, or one or more nano-scale structures, or even smaller scale structures in other embodiments.

Current ILD materials may exhibit low failure strain and low fracture toughness resulting in cracks, voids, and/or defects that compromise the integrity and reliability of microelectronic devices that integrate them. Current passivation materials may shrink after thermal cycling leading to reliability issues or product failure. Techniques and materials to increase the thermal and mechanical stability and/or reliability of polymer interlayer dielectrics and passivation materials are disclosed herein.

In an embodiment, a polymer for use as a polymer ILD 104 or polymer passivation layer in a microelectronic device has relatively higher failure strain, higher fracture toughness, higher modulus, and/or lower CTE compared with current ILD and/or passivation materials.

In an embodiment, Table 1 below provides target mechanical and thermal properties for polymer ILD 104 and/or passivation. A polymer for microelectronic polymer ILD 104 and/or passivation may have a fracture toughness ($K_c$) greater than about 0.45 MPa·m$^{1/2}$, a failure strain greater than about 18%, a CTE less than about 60 ppm/K and a modulus greater than about 2.5 GPa.

TABLE 1

| Target Mechanical and Thermal Properties for Polymer ILD and/or Passivation | |
|---|---|
| Mechanical and thermal properties | Polymer for Microelectronic ILD and/or Passivation |
| Fracture Toughness ($K_c$) | >0.45 |
| Failure Strain (%) | >18 |
| CTE (ppm/K) | <60 |
| Modulus (GPa) | >2.5 |

In an embodiment, a polymer for microelectronic polymer ILD 104 and/or passivation includes a first polymer resin with associated first cross-linker and a second polymer resin with associated second cross-linker. In an embodiment, a first polymer resin includes polyimide and first cross-linker includes tri-functional curing agents/cross-linkers such as alkyl phenolictriazene. In another embodiment, a second polymer resin includes novolak or phenolic resin and second cross-linker includes curing agents/cross-linkers such as tri-methylbenzaldehyde. A polymer for microelectronic polymer ILD 104 and/or passivation may include copolymer backbones of the first and second polymer resins cross-linked with the first and/or second cross-linkers.

Selecting a degree of cross-linking to provide a target molecular weight of copolymer backbones between cross-links in a network polymer, such as polymer ILD 104, may increase surface area for cohesive forces to act between polymer chains resulting in increased crack propagation resistance. In an embodiment, a polyimide and novolak copolymer backbone is cross-linked such that the molecular weight of the copolymer backbone between cross-links is between about 10 to 15 kg/mol. Such embodiment may provide a material with properties that comport with Table 1.

A polymer for polymer ILD 104 or passivation may include a polymer backbone with a molecular weight of about 10 to 15 kg/mol between cross-links. Increasing the network molecular weight while keeping cross-link density constant may increase failure strain, fracture toughness, modulus, and toughness. In an embodiment, a target molecular weight between cross-linker for a polyimide base resin is about 12 kg/mol. In another embodiment, a target molecular weight between cross-linker for novolak is about 15 kg/mol.

The cross-Linking density of a polymer ILD 104 or polymer passivation may be selected to provide flexibility, less brittle behavior, and/or reduced CTE in a resultant polymer ILD 104 or polymer passivation. Increasing cross-linking may increase network rigidity and planarity of a post-cure polymer dielectric layer or film 104. In an embodiment, the cross-linking density of polymer ILD 104 or passivation is about 4 to 8 polymer backbone chains per network. A network as described herein may refer to a number of backbone polymer chains or base resin chains chemically bonded together through cross-links. Networks of backbone polymer chains may be coupled together physically by entangling, for example, but not by covalent bonds, for example. In an embodiment, the molecular weight of a cross-linker is greater than about 1 kg/mol. In an embodiment, cross-linkers, such as alkyl phenolictriazene and/or trimethylbenzaldehyde, function as both curing agents and cross-linkers eliminating a need for additional curing agents. Other curing agents may be used in other embodiments.

In an embodiment, planar or linear polymer molecules, such as novolak and/or polyimide, stack better than non-planar or non-linear structures. Planar or linear polymer molecules may include molecules having aromatic functional groups that are part of the polymer backbone. Non-planar or non-linear molecules may include molecules having pendant-like structures, such as aromatic functional groups, that hang off the polymer backbone. Better chain stacking may increase modulus and fracture toughness, for example.

In an embodiment, polymer ILD 104 is a low-k dielectric for use as a low-k ILD in a microelectronic device. In an embodiment, polymer ILD 104 has a dielectric constant, k, of about 2 to 2.5. An apparatus 100 may include a first interconnect layer having a first interconnect structure 106 such as a via or contact and polymer ILD 104. The first interconnect layer may be referred to as via 0 ($V_0$) or contact. The first interconnect structure 106 may be electrically coupled to one or more transistor structures 102 and may provide an electrical pathway to interconnect structures 108, 110, 112, 114 of succeeding interconnect layers. Succeeding interconnect layers may include alternating layers of interconnect line structures 108, 112 and via structures 110, 114. The succeeding interconnect layers may be referred to as metal 1 ($M_1$), via 1 ($V_1$), metal 2 ($M_2$) and so forth until a final metal n ($M_n$) layer, in which n represents any integer greater than zero and may include values greater than ten, for example.

Each interconnect layer may include low-k polymer ILD 104 in accordance with embodiments described herein. A low-k dielectric property may be more important for interconnect layers closer to the transistor structures 102 such as $V_0$ to $V_3$, for example. In an embodiment, one or more polymeric dielectric layers 104 include low-k ILD having a dielectric constant, k, of about 2 to 2.5. In another embodiment, polymeric dielectric layers 104 include a polymer having a k of about 2.3 to 2.5.

In an embodiment, an apparatus 100 includes one or more interconnect structures 106, 108, 110, 112, 114 of a microelectronic device and one or more polymeric dielectric layers 104 coupled with the one or more interconnect structures 106, 108, 110, 112, 114. The polymeric dielectric layers 104 may include copolymer backbones having a first monomeric unit and a second monomeric unit. In an embodiment, the first monomeric unit has a different chemical structure from the second monomeric unit. The copolymer backbones may be cross-linked by a first cross-linker or a second cross-linker, or combinations thereof. In an embodiment, the first monomeric unit includes polyimide and the second monomeric unit includes novolak. In another embodiment, the first cross-linker includes alkyl phenolictriazene and the second cross-linker includes tri-methylbenzaldehyde.

The cross-link density of the polymeric dielectric layers 104 may be such that an average molecular weight of the copolymer backbones between cross-links is about 10 to 15 kg/mol in the polymeric dielectric layers 104. The average molecular weight of the first and/or second cross-linker may be greater than about 1 kg/mol in the polymeric dielectric layers 104.

An apparatus 100 may further include one or more transistor structures 102 coupled with the one or more interconnect structures 106, 108, 110, 112, 114 by a contact interconnect 106, the contact interconnect 106 being coupled to the one or more polymeric dielectric layers 104. One or more barrier films 116, 118, 120, 122, 124, 126, 128, 130, 132, 134 may be coupled with the one or more interconnect structures 106, 108, 110, 112, 114 such that the barrier films are disposed between the one or more polymeric dielectric layers 104 material and the one or more interconnect structures 106, 108, 110, 112, 114. In an embodiment, the term barrier film refers to a barrier film 116 and a liner 118 together. One or more etch stop films may also be coupled with the one or more polymeric dielectric layers 104.

In an embodiment, one or more interconnect structures 106, 108, 110, 112, 114 include copper (Cu), aluminum (Al), cobalt (Co), gold (Au), tungsten (W), platinum (Pt), any suitable electrically conductive material, or combinations thereof. Barrier films 116, 120, 124, 128, 132 may include, for example, tantalum nitride (TaN) and liners 118, 122, 126, 130, 134 may include, for example, (Ta) tantalum. In other embodiments, barrier films 116, 120, 124, 128, 132 may include titanium nitride (TiN), molybdenum nitride (MoN) or other suitable materials. Liners 118, 122, 126, 130, 134 may include Ti, Mo, or other suitable materials. Carbon or nitride based materials may be used as an etch stop 136, 138, 140.

Figure 2:
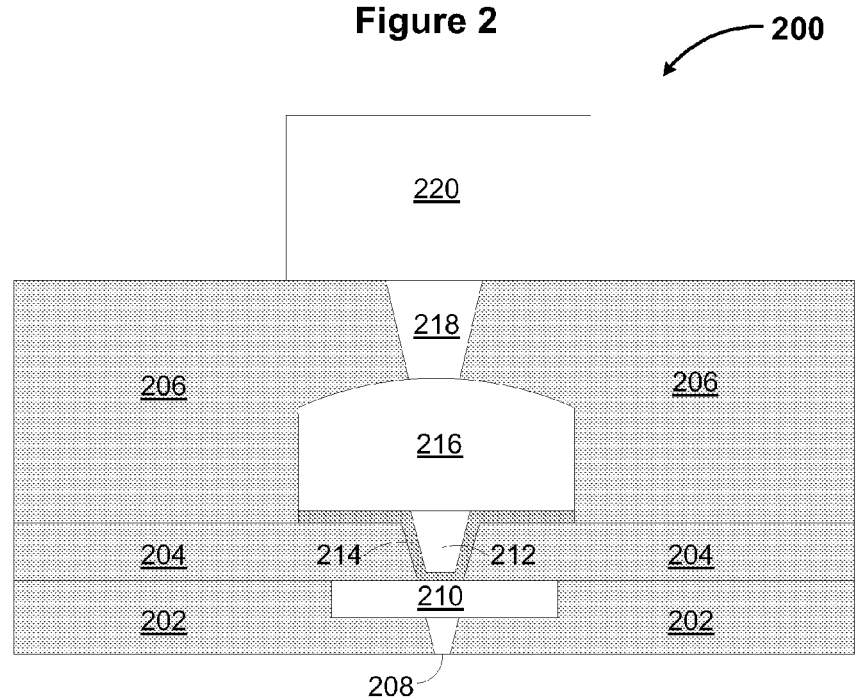
FIG. 2 is a cross-sectional side view of polymer passivation material for a microelectronic device, according to but one embodiment.

FIG. 2 is a cross-sectional side view of polymer passivation material for a microelectronic device, according to but one embodiment. In an embodiment, an apparatus 200 includes interlayer dielectric 202, 204, passivation layer 206, and one or more interconnect structures 208, 210, 212, 216, 218, 220, each coupled as shown. An apparatus 200 may further include a barrier film 214. ILD 202, 204 and passivation layer 206 may by polymer dielectric layers that accord with embodiments already described with respect to FIG. 1. In other embodiments, polymer dielectric material may be used for any or all dielectric structures 202, 204, 206 including ILD, build-up dielectrics and/or passivation.

In an embodiment, an apparatus 200 includes one or more interconnect bumps 220 electrically coupled with one or more interconnect structures 208, 210, 212, 216, 218, which may be analogous to interconnect structures depicted with respect to FIG. 1. A polymeric dielectric layer may include a passivation layer 206 of a microelectronic device coupled to one or more interconnect bumps 220 and/or structures 216, 218, as shown.

In one embodiment, barrier films 214 are not required between the one or more interconnect structures 208, 210, 212, 216, 218, 220. In an embodiment, no barrier film is disposed between the passivation layer 206 and the one or more interconnect bumps 220 and no barrier film is disposed between the passivation layer and the one or more interconnect structures 216, 218. In other embodiments, barrier films are disposed between the passivation 206 and the one or more interconnect structures 216, 218. For example, barrier films may include a nitride layer (not shown) to seal the metal interconnect 216. A barrier film may also include barrier materials 214 analogous to barriers films and/or liners described with respect to FIG. 1. Such barrier materials 214 may also be disposed between interconnect structures 218, 220 and passivation material 206 in other embodiments.

ILD 204 may be a build-up dielectric. In an embodiment, ILD 204 includes polymer dielectric material that accords with embodiments described herein. In other embodiments, ILD 204 includes dielectric material such as silicon nitride (SiN), silicon dioxide ($SiO_2$), or carbon-doped oxide (CDO), for example.

Figure 3:
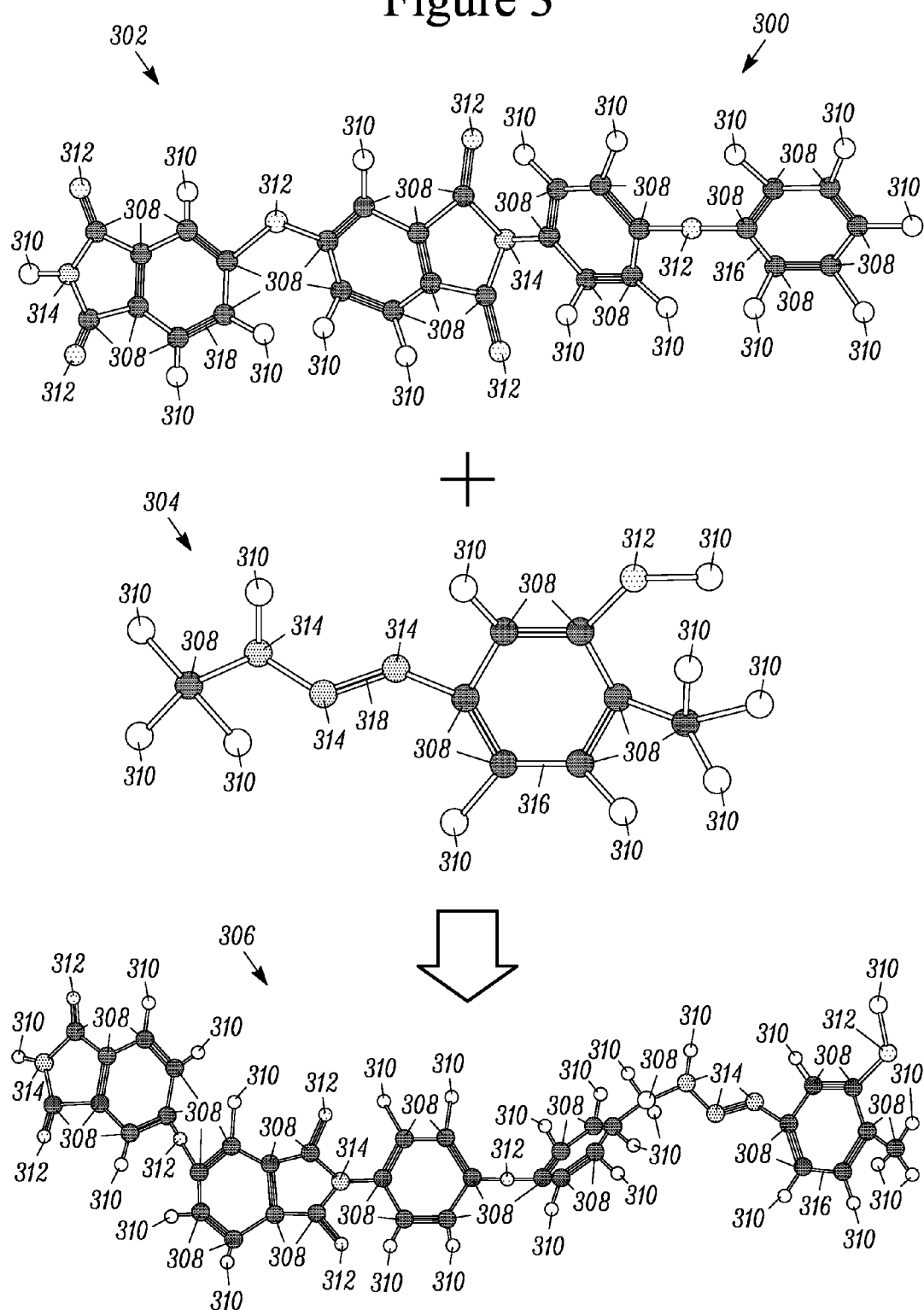
FIG. 3 is a schematic of a component chemical reaction for a polymer dielectric or passivation material, according to but one embodiment.

FIG. 3 is a schematic of a component chemical reaction for a polymer dielectric or passivation material, according to but one embodiment. In an embodiment, component chemical reaction 300 includes combining base resin polyimide 302 and cross-linker alkyl phenolictriazene 304 to form class A polymer structure 306. Base resin polyimide 302, cross-linker alkyl phenolictriazene 304, and class A polymer structure 306 may include carbon atoms 308, hydrogen atoms 310, oxygen atoms 312, nitrogen atoms 314, single bonds 316, and/or double-bonds 318, each coupled as shown. The class A polymer structure 306 may include double bonds 318 similar or identical to those depicted for base resin polyimide 302 and cross-linker alkyl phenolictriazene 304. Class A polymer structure 306 may have a heat of formation of about −6.5 eV at 0 K. In an embodiment, class A polymer 306 has a dielectric constant, k, of about 2.4.

Figure 4:
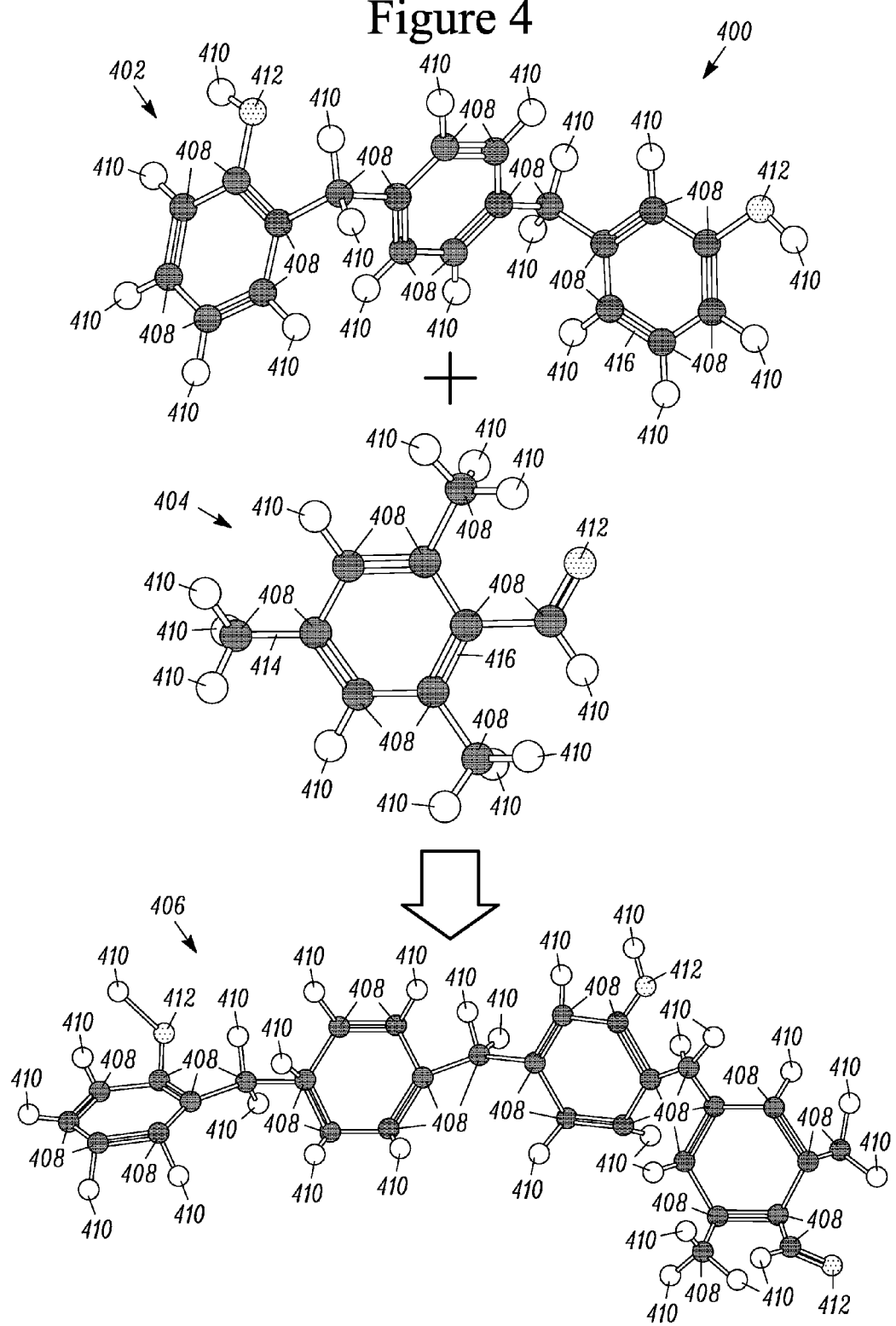
FIG. 4 is another schematic of a component chemical reaction for a polymer dielectric or passivation material, according to but one embodiment.

FIG. 4 is another schematic of a component chemical reaction for a polymer dielectric or passivation material, according to but one embodiment. In an embodiment, component chemical reaction 400 includes combining base resin novolak 402 and cross-linker tri-methylbenzaldehyde 404 to form class B polymer structure 406. Base resin novolak 402, cross-linker tri-methylbenzaldehyde 404 and class B polymer structure 406 may include carbon atoms 408, hydrogen atoms 410, oxygen atoms 412, single bonds 414, and/or double bonds 416, each coupled as shown. The class B polymer structure 406 may include double bonds 416 similar or identical to those depicted for base resin novolak 402 and cross-linker tri-methylbenzaldehyde 404. Class B polymer structure 308 may have a heat of formation of about 0.5 eV at 0 K. A time or temperature for curing may be selected to increase class B polymer yields. In an embodiment, class B polymer 308 has a dielectric constant, k, of about 2.3.

TABLE 2

Model Prediction of Thermal and Mechanical Properties of Polymers

| Samples | Average Molecular Weight between cross-links (kg/mol) | CTE (300-200 K) ppm/K | Toughness (MPa) | Failure Strain (%) | Modulus in Tension (GPa) | Tensile Strength (MPa) |
|---|---|---|---|---|---|---|
| Polymer: Class A | 12 | 41 | 15 | 21 | 3.3 | 138 |
| Polymer: Class B | 15 | 59 | 9 | 18 | 2.6 | 87 |

Table 2 includes a model prediction of thermal and mechanical properties of class A and class B polymers. For an average molecular weight between cross-links of about 12 kg/mol, class A polymer may have a CTE of about 41 ppm/K, a toughness of about 15 MPa, a failure strain of about 21%, a modulus in tension of about 3.3 GPa, a tensile strength of about 138 MPa, and a fracture toughness of about 0.54 $MPa \cdot m^{1/2}$. For an average molecular weight between cross-links of about 15 kg/mol, class B polymer may have a CTE of about 59 ppm/K, a toughness of about 9 MPa, a failure strain of about 18%, a modulus in tension of about 2.6 GPa, a tensile strength of about 87 MPa, and a fracture toughness of about 0.45 $MPa \cdot m^{1/2}$. In an embodiment, Class A and class B polymers are used separately, or combined together, to form one or more polymer or copolymer networks for use as a dielectric structure in a microelectronic device.

Figure 5:
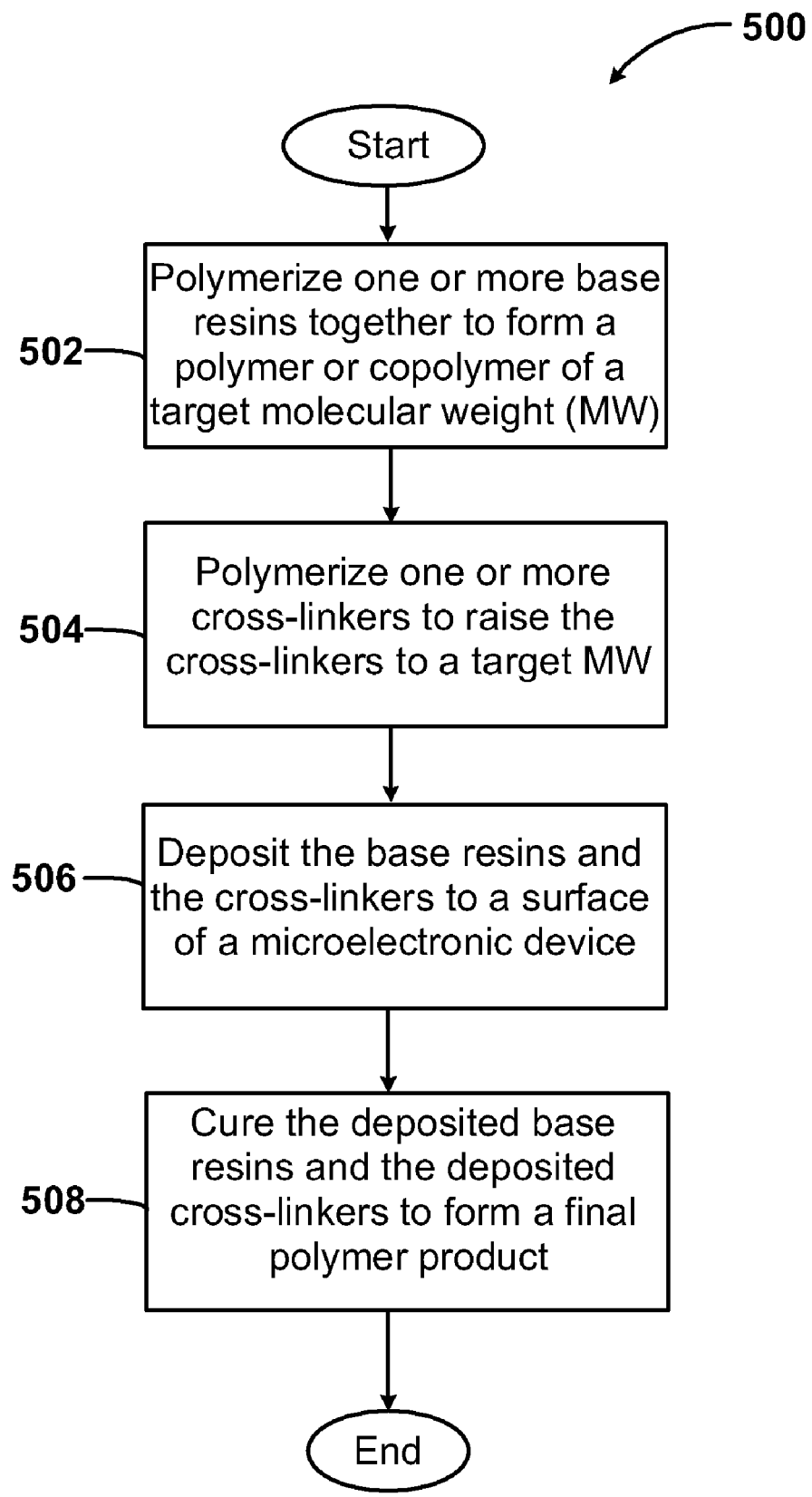
FIG. 5 is a flow diagram of a method for making a polymer interlayer dielectric or passivation layer, according to but one embodiment.

FIG. 5 is a flow diagram of a method for making a polymer interlayer dielectric or passivation layer, according to but one embodiment. In an embodiment, a method 500 includes polymerizing one or more base resins together to form a polymer or copolymer of a target molecular weight (MW) at box 502, polymerizing one or more cross-linkers to raise the cross-linkers to a target MW at box 504, depositing the base resins and the cross-linkers to a surface of a microelectronic device at box 506, and/or curing the deposited base resins and the deposited cross-linkers to form a final polymer product at box 508.

In an embodiment, a method 500 includes polymerizing at least a first base resin 502, a second base resin 502, a first cross-linker 504, and a second cross-linker 504 wherein at least the first and second base resins have different chemical structures. A method 500 may further include depositing the polymerized first base resin, second base resin, first cross-linker, and second cross-linker to a surface of a microelectronic device 506, and curing the deposited first and second base resins and the first and second cross-linkers 508 to form a polymeric dielectric layer on the surface of the microelectronic device.

Polymerizing at least a first base resin 502, a second base resin 502, a first cross-linker 504, and a second cross-linker 504 includes polymerizing at least the first base resin and the second base resin together 502 to form a copolymer of a first target average molecular weight. In another embodiment, polymerizing at least a first base resin 502, a second base resin 502, a first cross-linker 504, and a second cross-linker 504 includes polymerizing at least the first cross-linker and the second cross-linker 504 to raise the first and second cross-linkers to a second target average molecular weight. In an embodiment, the first base resin includes polyimide, the second base resin includes novolak, and the target average molecular weight of the copolymer is about 20 to 24 kg/mol. In another embodiment, the first cross-linker includes alkyl phenolictriazene, the second cross-linker includes tri-methylbenzaldehyde, and the target molecular weight of the first and second cross-linkers is greater than about 1 kg/mol.

Depositing the polymerized first base resin, second base resin, first cross-linker, and second cross-linker to a surface of a microelectronic device 506 may include depositing amounts of the polymerized first and second base resins and depositing amounts of the polymerized first and second cross-linkers to provide a cross-link density of about 4 to 8 polymerized first and second base resin chains per network such that an average molecular weight of the polymerized first and second base resins between cross-links is about 10 to 15 kg/mol in the polymeric dielectric layer.

Depositing the polymerized first base resin, second base resin, first cross-linker, and second cross-linker 506 may include spin coating the polymerized first base resin, second base resin, first cross-linker, and second cross-linker to the surface of the microelectronic device. Various actions may be performed prior to spin coating 506 including, for example, applying heat to the surface of the microelectronic device to remove moisture, which is sometimes referred to as soft-bake and depositing hexamethyldisilazane (HMDS) to prime the surface of the microelectronic device. Depositing HMDS may strengthen bonding between at least polymerized first and second base resins and the surface of the microelectronic device.

Depositing the polymerized first base resin, second base resin, first cross-linker, and second cross-linker 506 may include depositing by chemical vapor deposition (CVD). In an embodiment, plasma CVD is used to deposit the polymerized first base resin, second base resin, first cross-linker, and second cross-linker 506. Plasma CVD 506 may expose the wafer to volatile plasma precursors, which react or decompose on the substrate to form a final polymer product 508 such as a polymeric dielectric layer described herein. With plasma CVD, a separate curing action 508 may not be needed to generate cross-linking. For example, if plasma CVD 506 is used for deposition, the polymer materials may be simultaneously deposited 506 and cured 508. Curing 508 may be used after plasma CVD as well. In an embodiment, curing and/or annealing 508 is performed after the polymer is generated using plasma CVD to ensure volatile components are removed.

Curing the deposited first and second base resins and the first and second cross-linkers 508 may include heating the deposited first and second base resins and the first and second cross-linkers to remove volatile solvents and to form a solid polymeric dielectric layer. A curing 508 time and temperature may be selected to provide a cross-linking density of about 4 to 8 polymerized first and second base resin chains per network such that an average molecular weight of the polymerized first and second base resins between cross-links is about 10 to 15 kg/mol in the polymeric dielectric layer. In an embodiment, the first or second cross-linkers, or combinations thereof, function as curing agents and no additional curing agents are used while heating or curing 508.

Curing the deposited first and second base resins and the first and second cross-linkers 508 may form a polymeric dielectric layer on the surface of the microelectronic device. In an embodiment, the polymeric dielectric layer is an interlayer dielectric (ILD), a passivation layer, a build-up dielectric layer, or combinations thereof. Such polymeric dielectric layer may accord with embodiments described herein.

Various operations may be described as multiple discrete operations in turn, in a manner that is most helpful in understanding the invention. The order of description should not, however, be construed as to imply that these operations are necessarily order dependent. In particular, these operations need not be performed in the order of presentation. Operations described may be performed in a different order than the described embodiment. Various additional operations may be performed and/or described operations may be omitted in additional embodiments.

FIG. 6 is a diagram of an example system in which embodiments of the present invention may be used, according to but one embodiment. System 600 is intended to represent a range of electronic systems (either wired or wireless) including, for example, desktop computer systems, laptop computer systems, personal computers (PC), wireless telephones, personal digital assistants (PDA) including cellular-enabled PDAs, set top boxes, pocket PCs, tablet PCs, DVD players, or servers, but is not limited to these examples and may include other electronic systems. Alternative electronic systems may include more, fewer and/or different components.

In one embodiment, electronic system 600 includes an apparatus 100, 200 having polymer interlayer dielectric and/or passivation materials in accordance with embodiments described with respect to FIGS. 1-5. In an embodiment, an apparatus 100, 200 having polymer interlayer dielectric and/or passivation materials as described herein is part of an electronic system's processor 610 or memory 620.

Electronic system 600 may include bus 605 or other communication device to communicate information, and processor 610 coupled to bus 605 that may process information. While electronic system 600 may be illustrated with a single processor, system 600 may include multiple processors and/or co-processors. In an embodiment, processor 610 includes an apparatus 100, 200 having polymer interlayer dielectric and/or passivation materials in accordance with embodiments described herein. System 600 may also include random access memory (RAM) or other storage device 620 (may be referred to as memory), coupled to bus 605 and may store information and instructions that may be executed by processor 610.

Memory 620 may also be used to store temporary variables or other intermediate information during execution of instructions by processor 610. Memory 620 is a flash memory device in one embodiment. In another embodiment, memory 620 includes an apparatus 100, 200 having polymer interlayer dielectric and/or passivation materials as described herein.

System 600 may also include read only memory (ROM) and/or other static storage device 630 coupled to bus 605 that may store static information and instructions for processor 610. Data storage device 640 may be coupled to bus 605 to store information and instructions. Data storage device 640 such as a magnetic disk or optical disc and corresponding drive may be coupled with electronic system 600.

Electronic system 600 may also be coupled via bus 605 to display device 650, such as a cathode ray tube (CRT) or liquid crystal display (LCD), to display information to a user. Alphanumeric input device 660, including alphanumeric and other keys, may be coupled to bus 605 to communicate information and command selections to processor 610. Another type of user input device is cursor control 670, such as a mouse, a trackball, or cursor direction keys to communicate information and command selections to processor 610 and to control cursor movement on display 650.

Electronic system 600 further may include one or more network interfaces 680 to provide access to network, such as a local area network. Network as used with respect to this figure may refer to communications/electronic networks, not polymer networks as used with respect to other figures. Network interface 680 may include, for example, a wireless network interface having antenna 685, which may represent one or more antennae. Network interface 680 may also include, for example, a wired network interface to communicate with remote devices via network cable 687, which may be, for example, an Ethernet cable, a coaxial cable, a fiber optic cable, a serial cable, or a parallel cable.

In one embodiment, network interface 680 may provide access to a local area network, for example, by conforming to an Institute of Electrical and Electronics Engineers (IEEE) standard such as IEEE 802.11b and/or IEEE 802.11g standards, and/or the wireless network interface may provide access to a personal area network, for example, by conforming to Bluetooth standards. Other wireless network interfaces and/or protocols can also be supported.

IEEE 802.11b corresponds to IEEE Std. 802.11b-1999 entitled "Local and Metropolitan Area Networks, Part 11: Wireless LAN Medium Access Control (MAC) and Physical Layer (PHY) Specifications: Higher-Speed Physical Layer Extension in the 2.4 GHz Band," approved Sep. 16, 1999 as well as related documents. IEEE 802.11g corresponds to IEEE Std. 802.11g-2003 entitled "Local and Metropolitan Area Networks, Part 11: Wireless LAN Medium Access Control (MAC) and Physical Layer (PHY) Specifications, Amendment 4: Further Higher Rate Extension in the 2.4 GHz Band," approved Jun. 27, 2003 as well as related documents. Bluetooth protocols are described in "Specification of the Bluetooth System: Core, Version 1.1," published Feb. 22, 2001 by the Bluetooth Special Interest Group, Inc. Previous or subsequent versions of the Bluetooth standard may also be supported.

In addition to, or instead of, communication via wireless LAN standards, network interface(s) 680 may provide wireless communications using, for example, Time Division, Multiple Access (TDMA) protocols, Global System for Mobile Communications (GSM) protocols, Code Division, Multiple Access (CDMA) protocols, and/or any other type of wireless communications protocol.

In an embodiment, a system 600 includes one or more omnidirectional antennae 685, which may refer to an antenna that is at least partially omnidirectional and/or substantially omnidirectional, and a processor 610 coupled to communicate via the antennae.

The above description of illustrated embodiments, including what is described in the Abstract, is not intended to be exhaustive or to limit to the precise forms disclosed. While specific embodiments and examples are described herein for illustrative purposes, various equivalent modifications are possible within the scope of this description, as those skilled in the relevant art will recognize.

These modifications can be made in light of the above detailed description. The terms used in the following claims should not be construed to limit the scope to the specific embodiments disclosed in the specification and the claims. Rather, the scope of the embodiments disclosed herein is to be determined by the following claims, which are to be construed in accordance with established doctrines of claim interpretation.

What is claimed is:

1. An apparatus, comprising:
   one or more interconnect structures of a microelectronic device; and
   one or more polymeric dielectric layers coupled with the one or more interconnect structures, the polymeric dielectric layers comprising copolymer backbones having a first monomeric unit and a second monomeric unit, wherein the first monomeric unit has a different chemical structure than the second monomeric unit and wherein the copolymer backbones are cross-linked by a first cross-linker and a second cross-linker.

2. An apparatus according to claim 1, wherein the first monomeric unit comprises polyimide, the second monomeric unit comprises novolak, the first cross-linker comprises alkyl phenolictriazene, and the second cross-linker comprises trimethylbenzaldehyde.

3. An apparatus according to claim 2, wherein a cross-link density of the polymeric dielectric layers is such that an average molecular weight of the copolymer backbones between cross-links is about 10 to 15 kg/mol in the polymeric dielectric layers and wherein an average molecular weight of the first or second cross-linker is greater than about 1 kg/mol in the polymeric dielectric layers.

4. An apparatus according to claim 1, wherein the one or more polymeric dielectric layers comprise low-k interlayer dielectric (ILD) having a dielectric constant, k, of about 2 to 2.5.

5. An apparatus according to claim 1, further comprising:
   one or more interconnect bumps electrically coupled with the one or more interconnect structures wherein the one or more polymeric dielectric layers comprise a passivation layer of the microelectronic device, the passivation layer being coupled with the one or more interconnect bumps.

6. An apparatus according to claim 5, wherein no barrier film is disposed between the passivation layer and the one or more interconnect bumps and wherein no barrier film is disposed between the passivation layer and the one or more interconnect structures.

7. An apparatus according to claim 1, wherein the one or more interconnect structures comprise via or contact interconnects and line interconnects, the apparatus further comprising:
   one or more transistors electrically coupled with the one or more interconnect structures by a contact interconnect, the contact interconnect being coupled to the one or more polymeric dielectric layers;
   one or more interconnect bumps electrically coupled with the one or more interconnect structures;
   one or more barrier films coupled with the one or more interconnect structures wherein the barrier films are disposed between the one or more polymeric dielectric layers and the one or more interconnect structures; and
   one or more etch stop films coupled with the one or more polymeric dielectric layers.

8. An apparatus according to claim 3, wherein the one or more polymeric dielectric layers comprise low-k interlayer dielectric (ILD) having a dielectric constant, k, of about 2 to 2.5.

9. An apparatus according to claim 8, further comprising:
   one or more interconnect bumps electrically coupled with the one or more interconnect structures wherein the one or more polymeric dielectric layers comprise a passivation layer of the microelectronic device, the passivation layer being coupled with the one or more interconnect bumps.

10. An apparatus according to claim 9, wherein no barrier film is disposed between the passivation layer and the one or more interconnect bumps and wherein no barrier film is disposed between the passivation layer and the one or more interconnect structures.

11. An apparatus according to claim 10, wherein the one or more interconnect structures comprise via or contact interconnects and line interconnects, the apparatus further comprising:
  one or more transistors electrically coupled with the one or more interconnect structures by a contact interconnect, the contact interconnect being coupled to the one or more polymeric dielectric layers;
  one or more interconnect bumps electrically coupled with the one or more interconnect structures;
  one or more barrier films coupled with the one or more interconnect structures wherein the barrier films are disposed between the one or more polymeric dielectric layers and the one or more interconnect structures; and
  one or more etch stop films coupled with the one or more polymeric dielectric layers.

12. An apparatus according to claim 4, wherein the first monomeric unit comprises polyimide, the second monomeric unit comprises novolak, the first cross-linker comprises alkyl phenolictriazene, and the second cross-linker comprises trimethylbenzaldehyde.

13. An apparatus according to claim 12, wherein a cross-link density of the polymeric dielectric layers is such that an average molecular weight of the copolymer backbones between cross-links is about 10 to 15 kg/mol in the polymeric dielectric layers and wherein an average molecular weight of the first or second cross-linker is greater than about 1 kg/mol in the polymeric dielectric layers.

14. An apparatus according to claim 6, wherein the first monomeric unit comprises polyimide, the second monomeric unit comprises novolak, the first cross-linker comprises alkyl phenolictriazene, and the second cross-linker comprises trimethylbenzaldehyde.

15. An apparatus according to claim 14, wherein a cross-link density of the polymeric dielectric layers is such that an average molecular weight of the copolymer backbones between cross-links is about 10 to 15 kg/mol in the polymeric dielectric layers and wherein an average molecular weight of the first or second cross-linker is greater than about 1 kg/mol in the polymeric dielectric layers.

16. An apparatus according to claim 7, wherein the first monomeric unit comprises polyimide, the second monomeric unit comprises novolak, the first cross-linker comprises alkyl phenolictriazene, and the second cross-linker comprises trimethylbenzaldehyde.

17. An apparatus according to claim 16, wherein a cross-link density of the polymeric dielectric layers is such that an average molecular weight of the copolymer backbones between cross-links is about 10 to 15 kg/mol in the polymeric dielectric layers and wherein an average molecular weight of the first or second cross-linker is greater than about 1 kg/mol in the polymeric dielectric layers.

18. An apparatus according to claim 17, wherein the one or more polymeric dielectric layers comprise low-k interlayer dielectric (ILD) having a dielectric constant, k, of about 2 to 2.5.

19. An apparatus according to claim 18, further comprising:
  one or more interconnect bumps electrically coupled with the one or more interconnect structures wherein the one or more polymeric dielectric layers comprise a passivation layer of the microelectronic device, the passivation layer being coupled with the one or more interconnect bumps.

20. An apparatus according to claim 19, wherein no barrier film is disposed between the passivation layer and the one or more interconnect bumps and wherein no barrier film is disposed between the passivation layer and the one or more interconnect structures.

* * * * *